US008462270B2

(12) United States Patent
Araki

(10) Patent No.: US 8,462,270 B2
(45) Date of Patent: Jun. 11, 2013

(54) DIGITAL IMAGE TRANSMISSION APPARATUS FOR TRANSMITTING VIDEO SIGNALS HAVING VARIED CLOCK FREQUENCIES

(75) Inventor: Mikio Araki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1387 days.

(21) Appl. No.: 11/791,529

(22) PCT Filed: Feb. 24, 2006

(86) PCT No.: PCT/JP2006/003452

§ 371 (c)(1), (2), (4) Date: May 24, 2007

(87) PCT Pub. No.: WO2006/100873

PCT Pub. Date: Sep. 28, 2006

(65) Prior Publication Data

US 2007/0263122 A1 Nov. 15, 2007

(30) Foreign Application Priority Data

Mar. 22, 2005 (JP) ................................ P2005-082096

(51) Int. Cl.
*H03L 7/00* (2006.01)
*H04J 3/06* (2006.01)

(52) U.S. Cl.
USPC ........... 348/537; 348/552; 345/520; 370/503; 375/354

(58) Field of Classification Search
USPC .... 348/552, 511, 536, 537, 723, 512; 345/99, 345/523, 600, 634, 661, 698, 210–215, 501, 345/520; 375/354, 355, 362, 371, 373, 376
See application file for complete search history.

(56) References Cited

U.S. PATENT DOCUMENTS

| | | | | |
|---|---|---|---|---|
| 6,781,581 | B1 * | 8/2004 | Lee | 345/213 |
| 6,816,131 | B2 | 11/2004 | Narui et al. | |
| 2002/0030695 | A1 | 3/2002 | Narui et al. | |
| 2003/0067454 | A1 * | 4/2003 | Shin et al. | 345/204 |
| 2004/0139362 | A1 | 7/2004 | Inaba | |

FOREIGN PATENT DOCUMENTS

| | | | |
|---|---|---|---|
| JP | 63-142388 | A | 6/1988 |
| JP | 5-304465 | A | 11/1993 |
| JP | 5-308497 | A | 11/1993 |
| JP | 6-105246 | A | 4/1994 |
| JP | 10-49103 | A | 2/1998 |
| JP | 10-207442 | A | 8/1998 |

(Continued)

*Primary Examiner* — Michael Lee

(74) *Attorney, Agent, or Firm* — Birch, Stewart, Kolasch & Birch, LLP

(57) ABSTRACT

When transmitting a digital video signal having, as a variant clock signal, a clock signal of a frequency which does not fall within a predetermined frequency range, a frequency multiplier 21 carries out a frequency conversion of the frequency of the variant clock signal so as to generate a transmit side clock signal which falls within the predetermined frequency range, and a transmitting unit transmits, as a transmission digital video signal, the digital image data and control signal, as well as the transmit side clock signal, according to this transmit side clock signal. A receive side divides the frequency of the transmit side clock signal using a frequency divider 22 to obtain the variant clock signal after acquiring the digital image data and control signal from the transmit side digital video signal according to the transmit side clock signal.

5 Claims, 5 Drawing Sheets

FOREIGN PATENT DOCUMENTS

| | | | | |
|---|---|---|---|---|
| JP | 10-215421 | A | | 8/1998 |
| JP | 11-265168 | | * | 9/1999 |
| JP | 11-265168 | A | | 9/1999 |
| JP | 11-265168 | A | * | 9/1999 |
| JP | 2001-282216 | A | | 10/2001 |
| JP | 2002-207458 | A | | 7/2002 |
| JP | 2003-512652 | A | | 4/2003 |
| JP | 2003-318741 | A | | 11/2003 |

* cited by examiner

DIGITAL IMAGE TRANSMISSION APPARATUS FOR TRANSMITTING VIDEO SIGNALS HAVING VARIED CLOCK FREQUENCIES

CROSS REFERENCE TO RELATED APPLICATIONS

This application claims the benefit of Japanese Application No. JP2005-082096 filed on Mar. 22, 2005.

FIELD OF THE INVENTION

The present invention relates to a digital image transmission apparatus for transmitting a digital video signal to a display device. More particularly, it relates to a digital image transmission apparatus which is used in order to transmit a video signal of a variant type whose frequency does not fall within the timing clock frequency range of digital video signals which are standardized beforehand.

BACKGROUND OF THE INVENTION

In general, when carrying out digital transmission of a video signal, in order to improve noise immunity performance, and to implement operating signalizing and reduce the number of signal lines, the digital video signal is transmitted after parallel-to-serial conversion is performed on the digital video signal. An IC (integrated circuit) used for the operating signalizing and parallel-to-serial conversion deals with (or covers) only the timing clock frequency range of standardized digital video signals, but cannot transmit any digital video signal whose frequency does not fall within this timing clock range because it is premised on transmission of such a digital video signal which is standardized beforehand, as in a case of, for example, VGA (Video Graphics Array).

On the other hand, there are various types of display units which display digital video signals, and in a case in which a display unit which receives a digital video signal whose frequency does not fall within the timing clock frequency range of standardized digital video signals and displays this digital video signal is used, a digital image transmission display device which has an IC which deals with only the timing clock frequency range of standardized digital video signals cannot carry out any image display using the display unit. In other words, any digital video signal whose frequency does not fall within the timing clock frequency range of standardized digital video signals cannot be transmitted to a display unit having a display area of a variant type whose frequency range does not fall within the timing clock frequency range of standardized digital video signals.

By the way, there has been proposed a digital image transmission apparatus which in order to prevent interference which is caused by an asynchronous operation of a 1-bit D/A circuit, multiplies the frequency of a horizontal synchronizing signal demultiplexed from a digital video signal so as to generate an operation clock, and in which a video signal control circuit digital-to-analog-converts various control data according to the operation clock and outputs them to a graphic processing circuit, and is reset in response to a vertical synchronizing signal demultiplexed from the digital video signal. The video signal control circuit is reset in response to the vertical synchronizing signal to prevent the asynchronous interference (for example, refer to patent reference 1).

Furthermore, there has been proposed a digital TV receiver which processes two or more television signals having different broadcasting formats, and which in order to prevent malfunctions due to use of an unsuitable clock or the like using a clock which is suitable for the format of a digital video signal, thereby providing a good image display which does not have any disorder, performs television signal processing on the inputted video signal using a processor, and selects, as a clock to be furnished to the processor, a clock which conforms to the broadcasting format of the inputted video signal (for example, refer to patent reference 2).

In addition, there has been proposed a digital image transmission apparatus which in order to display a digital image signal which is sent from a host computer on a dot-matrix display panel with display parameters, such as a dot clock frequency according to the type of the host computer, performs an A/D conversion and an interpolation process on the input image signal, demultiplexes a synchronizing signal from the input image signal to measure the period of the synchronizing signal, reads a corresponding display parameter from a table stored in a memory unit according to this measured value, controls an A/D converter, a digital image processing unit, etc. according to this display parameter, and outputs line display image data and a display address to control the display of the dot-matrix display panel using the digital image processing unit (for example, refer to patent reference 3).

[Patent reference 1] JP, 10-207442, A (see pp. 3 and 4, and FIGS. 1 to 3)

[Patent reference 2] JP, 10-215421, A (see pp. 5 and 6, and FIGS. 1 to 3)

[Patent reference 3] JP, 10-49103, A (see pp. 3 to 6, and FIGS. 1 to 7)

A problem with the prior art digital image transmission apparatus constructed as mentioned above and disclosed by patent reference 1 is that while the interference caused by asynchronous operation is prevented by resetting the video signal control circuit in response to the vertical synchronizing signal demultiplexed from the video signal, it cannot transmit any video signal whose frequency does not fall within the timing clock frequency range of standardized digital video signals to a display unit provided with a display area of a variant type whose frequency range does not fall within the timing clock frequency range of standardized digital video signals.

A problem with the prior art digital image transmission apparatus constructed as mentioned above and disclosed by patent reference 2 is that it only selects a clock which conforms to the broadcasting format of the inputted video signal as a clock which is to be furnished to the processor, and it cannot transmit any video signal whose frequency does not fall within the timing clock frequency range of standardized digital video signals to a display unit provided with a display area of a variant type whose frequency range does not fall within the timing clock frequency range of standardized digital video signals.

A problem with the prior art digital image transmission apparatus constructed as mentioned above and disclosed by patent reference 3 is that while it measures the period of the synchronizing signal, reads a corresponding display parameter from the table stored in the memory unit according to this measured value, controls the A/D converter, digital image processing unit, etc. according to this display parameter, it only selects the display parameter only according to the frequency of the synchronizing signal, and it cannot transmit any video signal whose frequency does not fall within the timing clock frequency range of standardized digital video signals to a display unit provided with a display area of a variant type whose frequency range does not fall within the timing clock frequency range of standardized digital video signals.

The present invention is made in order to solve the above-mentioned problems, and it is therefore an object of the present invention to provide a digital image transmission apparatus which can transmit a video signal whose frequency does not fall within the timing clock frequency range of standardized digital video signals to a display unit provided with a display area of a variant type whose frequency range does not fall within the timing clock frequency range of standardized digital video signals.

DESCRIPTION OF THE INVENTION

In accordance with the present invention, there is provided a digital image transmission apparatus characterized in including: a transmit side frequency conversion means for, when transmitting a digital video signal having, as a variant clock signal, a clock signal of a frequency which does not fall within a predetermined frequency range, carrying out a frequency conversion of the frequency of the variant clock signal so as to generate a transmit side clock signal having a frequency which falls within the predetermined frequency range; a transmitting means for transmitting, as a transmission digital video signal, digital image data and a control signal, as well as the transmit side clock signal, according to this transmit side clock signal; a receiving means for receiving the transmit side digital video signal so as to acquire the digital image data and control signal according to the transmit side clock signal; and a receive side frequency conversion means for carrying out a frequency conversion of the transmit side clock signal so as to output the variant clock signal.

When transmitting a digital video signal having, as a variant clock signal, a clock signal of a frequency which does not fall within the predetermined frequency range, and when receiving digital broadcasting waves which, at least, conform to a modulation method which differs according to each hierarchy, the digital image transmission apparatus in accordance with the present invention carries out a frequency conversion of the frequency of the variant clock signal so as to generate a transmit side clock signal having a frequency which falls within the predetermined frequency range, performs a process of transmitting the digital image data and the control signal according to the transmit side clock signal, and the receive side of the digital image transmission apparatus converts the transmit side clock signal to the variant clock signal after performing a process of receiving the transmission digital video signal according to the transmit side clock signal. Therefore, the present invention offers an advantage of being able to transmit a digital video signal whose frequency does not fall within the clock frequency range of standardized digital video signals to a display unit provided with a display area of a variant type whose frequency range does not fall within the clock frequency range of standardized digital video signals.

PREFERRED EMBODIMENT OF THE INVENTION

Figure 1:
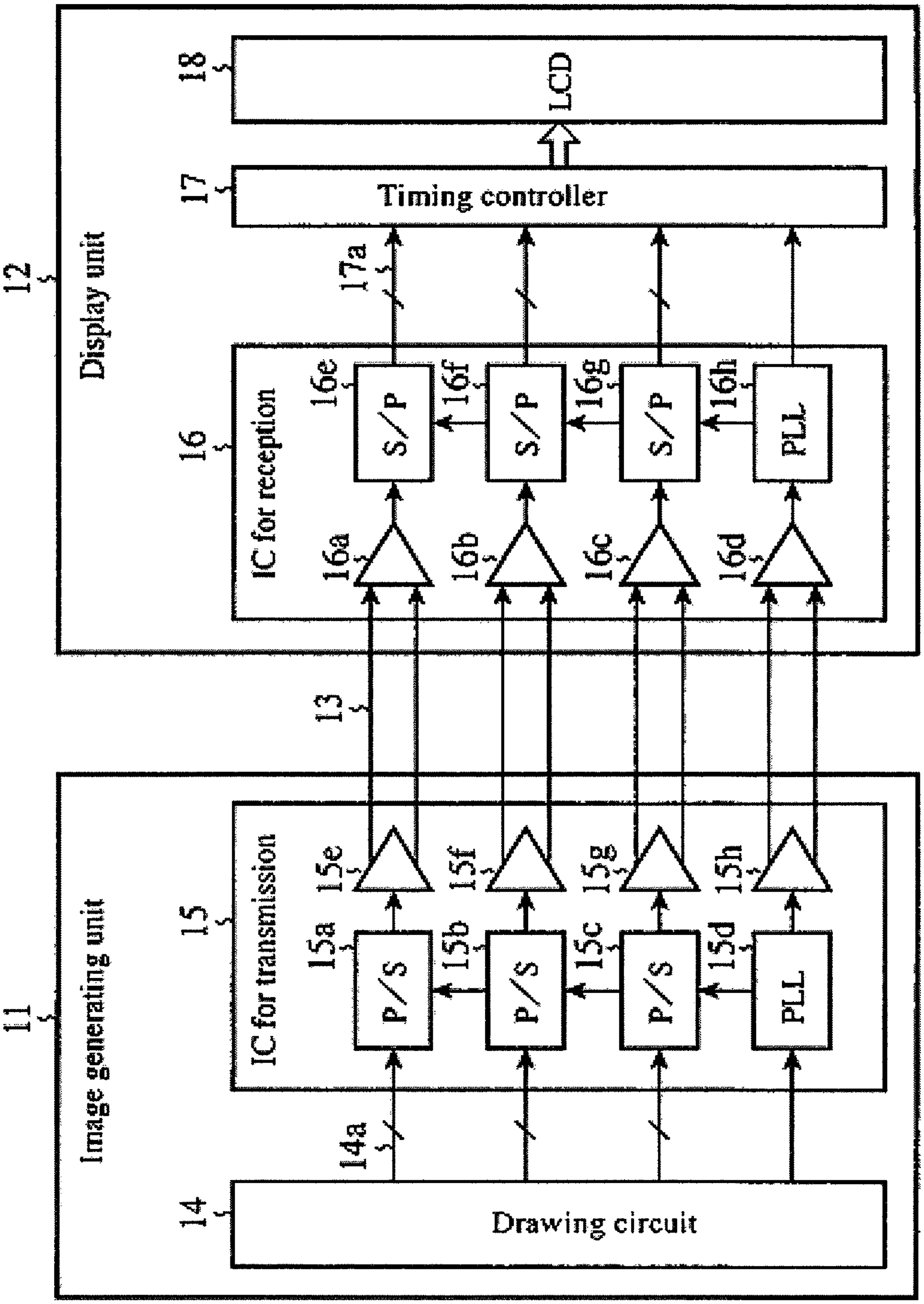
FIG. 1 PRIOR ART
FIG. 1 is a block diagram showing a prior art digital image transmission apparatus, as well as an image generating unit and a display unit, in order to make easy the understanding of embodiment 1 of the present invention.

Hereafter, in order to explain this invention in greater detail, the preferred embodiment of the present invention will be described with reference to the accompanying drawings.

Embodiment 1

First, a digital image transmission apparatus using a 21:3 LVDS (Low Voltage Differential Signaling) method will be explained with reference to FIG. 1. An image generating unit 11 and a display unit 12 are connected to transmission lines 13, and the image generating unit 11 is provided with a drawing circuit 14 and a control unit 15 for transmission (i.e., an IC for transmission: a transmitting means) and the display unit 12 is provided with a control unit 16 for reception (i.e., an IC for reception: a receiving means), a timing controller 17, and a display unit (LCD) 18. In this embodiment, the digital image transmission apparatus is constructed of the IC15 for transmission, transmission lines 13, and IC16 for reception.

Figure 2:
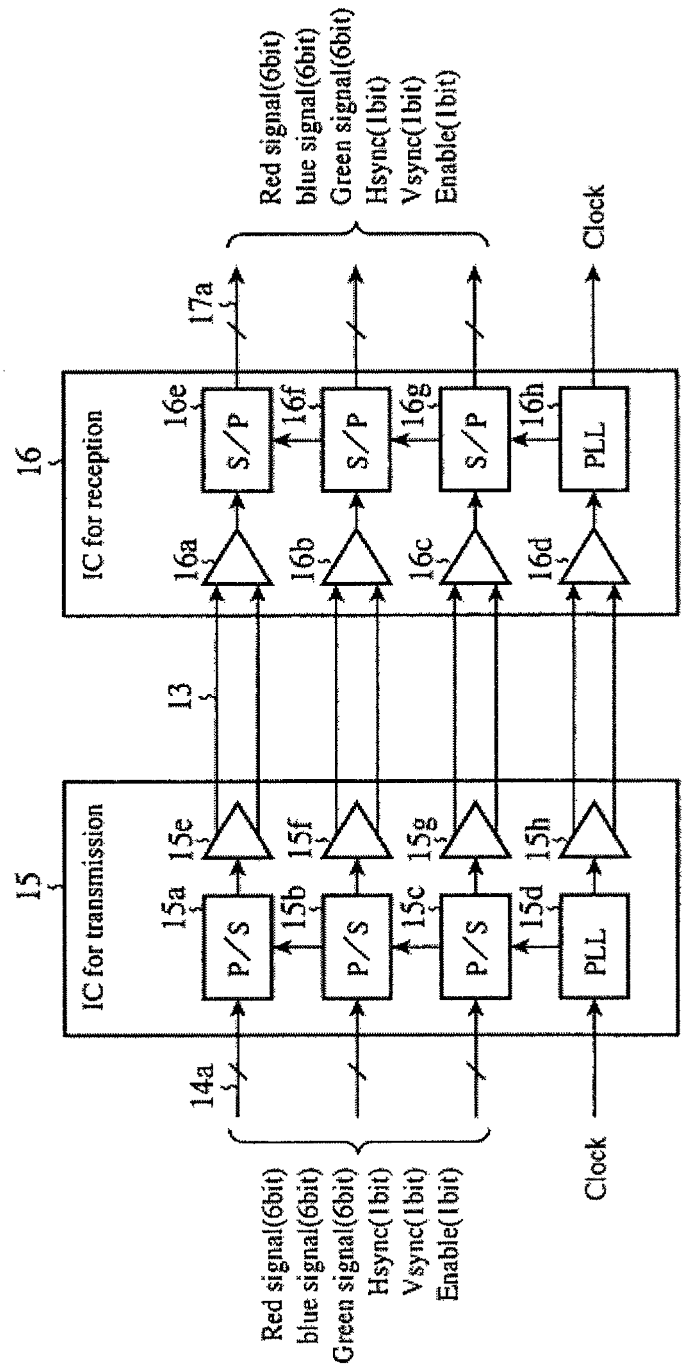
FIG. 2 PRIOR ART
FIG. 2 is a block diagram for explaining a transmission process carried out by the digital image transmission apparatus shown in FIG. 1.

The drawing circuit 14 generates a video signal and outputs it as a digital video signal. As shown in FIG. 2, this digital video signal includes a red signal (Red Signal (6 bits)), a blue signal (Blue Signal (6 bits)), a green signal (Green Signal (6 bits)), a horizontal synchronizing signal (Hsync (1 bit)), a vertical synchronizing signal (Vsync (1 bit)), an image enable signal (Enable (1 bit)), and a clock signal.

In the following explanation, the red signal, blue signal, and green signal are referred to as digital image data, and the horizontal synchronizing signal, vertical synchronizing signal, and image enable signal are referred to as control signals, respectively. These 21-bit data including the digital image data and control signals, and the clock signal (Clock) are, as parallel signals, transmitted to the IC 15 for transmission by way of four signal lines 14*a*.

The IC 15 for transmission has a plurality of 7:1 parallel-to-serial conversion circuits (P/S) 15*a* to 15*c*, and also has a PLL (Phase Locked Loop) circuit 15*d* and a plurality of LVDS signal conversion circuits 15*e* to 15*h*. The above-mentioned parallel signals are converted into serial signals by the plurality of parallel-to-serial conversion circuits 15*a* to 15*c*. In this case, the PLL circuit 15*d* generates a synchronizing signal for the plurality of parallel-to-serial conversion circuits 15*a* to 15*c* according to the clock signal, and provides this synchronizing signal to the plurality of parallel-to-serial conversion circuits 15*a* to 15*c*. That is, each of the plurality of parallel-to-serial conversion circuits 15*a* to 15*c* performs a parallel-to-serial conversion according to the synchronizing signal.

The above-mentioned serial signals are provided to the plurality of LVDS signal conversion circuits 15*e* to 15*g*, respectively, and the synchronizing signal (i.e., the clock signal) is given to the LVDS signal conversion circuit 15*h*. The serial signals and synchronizing signal are converted into LVDS signals (i.e., difference signals) by the plurality of LVDS signal conversion circuits 15*e* to 15*h*, respectively, and are sent out to the transmission lines 13 as a transmission digital video signal.

The IC 16 for reception has a plurality of LVDS demodulating circuits 16*a* to 16*d*, a plurality of serial-to-parallel conversion circuits 16*e* to 16*g*, and a PLL circuit 16*h*. The plurality of LVDS demodulating circuits 16*a* to 16*d* receive the LVDS signals (i.e., the transmission digital video signal) from the transmission lines 13, respectively, and convert them into TTL serial signals so as to acquire synchronizing signals, respectively. The plurality of serial-to-parallel conversion circuits 16*e* to 16*g* serial-to-parallel convert the serial signals which they have received from the plurality of LVDS demodulator circuits 16*a* to 16*c*, and output parallel signals.

On the other hand, the PLL circuit 16*h* generates a clock signal according to the synchronizing signal received from the LVDS demodulator circuit 16*d*, and provides this clock signal to the plurality of serial-to-parallel conversion circuits 16*e* to 16*g*. That is, the serial-to-parallel conversion circuits 16*e* to 16*g* perform serial-to-parallel conversions according to the clock signal, respectively.

These parallel signals (i.e., the digital image data including the red signal, blue signal, and green signal, and the control signals including the horizontal synchronizing signal Hsync, vertical synchronizing signal Vsync, and image enable signal Enable), and the clock signal (Clock) are provided to the timing controller 17 by way of four signal lines 17*a*, and the timing controller 17 generates a timing signal for image display according to these image data, control signals, and clock signal, controls the LCD 18, and displays an image on the LCD 18.

By the way, because the digital image transmission apparatus shown in FIG. 1 conforms to a predetermined standard size, for example, VGA or QVGA, each of the PLL circuits 15*d* and 16*h* has a frequency lead-in range according to the predetermined standard size. Incidentally, in the case of VGA, a digital video signal is the one of an 800×480 pixel image and has a clock frequency of 33 MHz, and, in the case of QVGA, a digital video signal is the one of a 480×234 pixel image and has a clock frequency of 8 MHz.

In the case of LVDS, the clock frequency range extends from 8 MHz to 34 MHz. Therefore, such a digital image transmission apparatus cannot transmit, as a digital video signal of a variant type, a digital video signal of a 277×124 pixel image, the video signal having a clock frequency of, for example, 6 MHz in the case of LVDS even though it tries to transmit the digital video signal because the clock frequency of the digital video signal deviates from the frequency lead-in range of each of the PLL circuits 15*d* and 16*h*.

Figure 3:
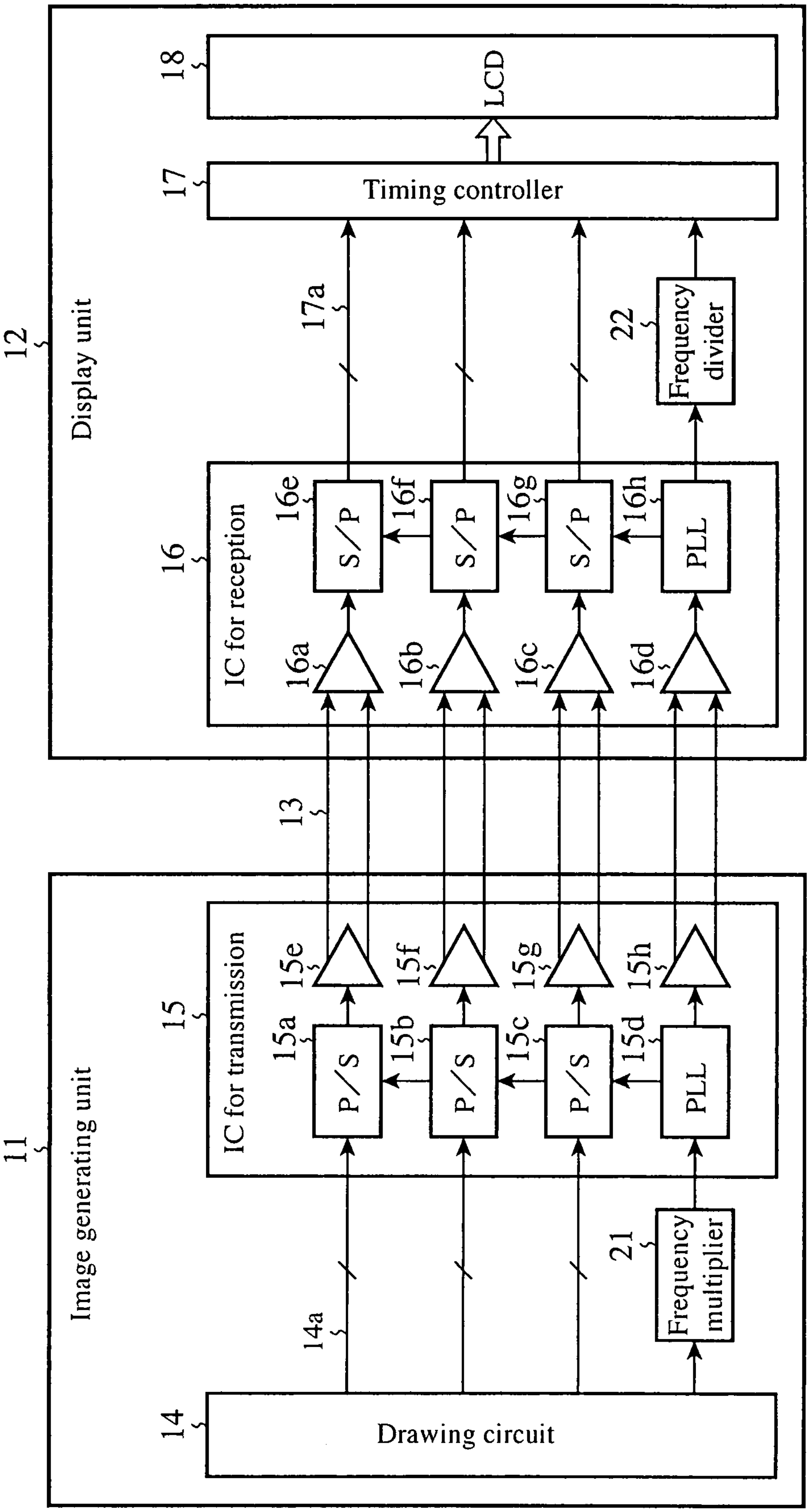
FIG. 3 is a block diagram showing an example of a digital image transmission apparatus in accordance with embodiment 1 of the present invention, as well as the image generating unit and display unit.

In order to solve such a problem, a digital image transmission apparatus shown in FIG. 3 is used. In FIG. 3, the same components as shown in FIG. 1 are designated by the same reference numerals. The digital image transmission apparatus shown in FIG. 3 includes a frequency multiplier (i.e., a transmit side frequency conversion means) 21 and a frequency divider (i.e., a receive side frequency conversion means) 22, the frequency multiplier 21 is arranged between a clock terminal of the drawing circuit 14 and an input terminal of the PLL circuit 15*d*, and the frequency divider 22 is arranged between an output terminal of the PLL circuit 16*h* and a clock terminal of the timing controller 17. In the example shown in the figure, the frequency multiplier 21 multiplies the frequency of the clock signal outputted from the drawing circuit 14 by a factor of two, and the frequency divider 22 divides the frequency of the clock signal outputted from the PLL circuit 16*h* by two.

Next, the operation of the digital image transmission apparatus in accordance with this embodiment of the present invention will be explained.

Figure 4:
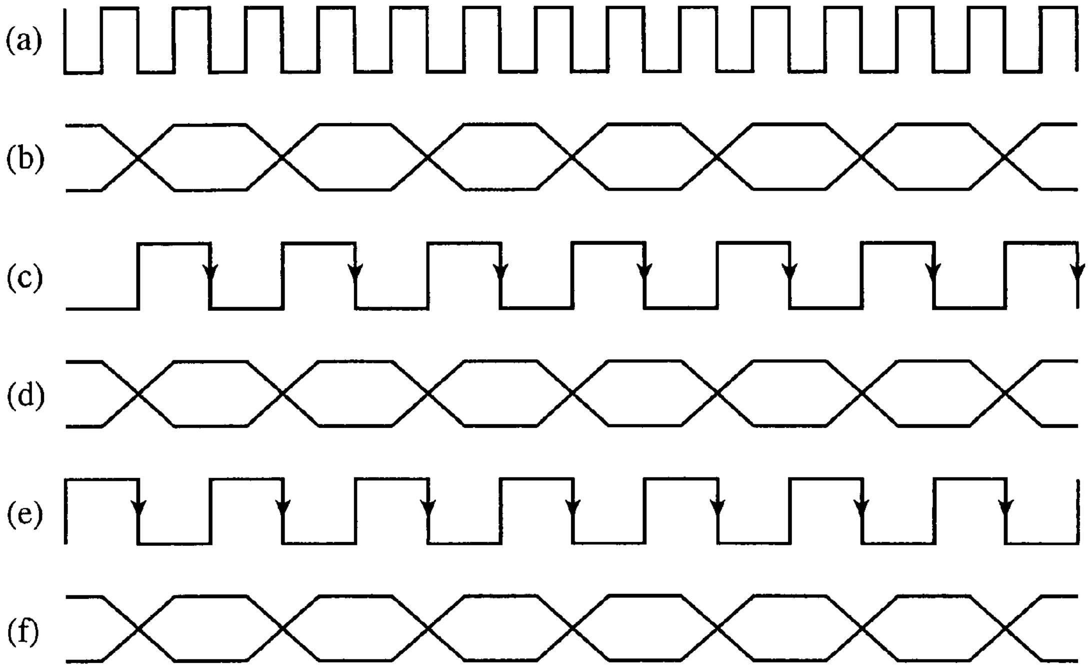
FIG. 4 is a timing chart for explaining a transmission process carried out by the digital image transmission apparatus shown in FIG. 3, FIG. 4(*a*) is a diagram showing a clock signal whose frequency is multiplied by a frequency multiplier, FIG. 4(*b*) is a diagram showing digital image data, FIG. 4(*c*) is a diagram showing a clock signal whose frequency is divided by a frequency divider, FIG. 4(*d*) is a diagram showing the digital image data from the viewpoint of a relation with the clock signal shown in FIG. 4(*c*), FIG. 4(*e*) is a diagram showing the clock signal in which a phase shift occurs, and FIG. 4(*f*) is a diagram showing the digital image data from the viewpoint of a relation with the clock signal shown in FIG. 4(*e*)

Referring now to FIGS. 3 and 4, when transmitting, as a digital video signal of a variant type, a digital video signal of a 277×124 pixel image, the video signal having a clock frequency of 6 MHz, the digital image transmission apparatus doubles the frequency of the clock signal (referred to as a 2× clock signal from here on) which is outputted from the drawing circuit 14 using the frequency multiplier 21 so as to make the clock signal have a clock frequency of 12 MHz, and provides it to the PLL circuit 15*d*, as shown in FIG. 4(*a*). Because in the case of LVDS the clock frequency range extends from 8 MHz to 34 MHz, the frequency of the 2× clock signal falls within the frequency lead-in range of the PLL circuit 15*d*, and therefore the digital image transmission apparatus can transmit the digital image data of the variant type shown in FIG. 4(*b*) using the IC 15 for transmission through LVDS.

On the other hand, the PLL circuits 16*h* receives the 2× clock signal by way of the LVDS demodulator circuit 16*d*, and the IC 16 for reception can receive the variant-type digital image data because the frequency of this 2× clock signal falls within the frequency lead-in range of the PLL circuit 16*h*. The frequency of the 2× clock signal outputted from the PLL circuit 16*h* is then divided by two by the frequency divider 22, and becomes the original clock signal shown in FIG. 4(*c*) (that is, it becomes a clock signal having a frequency of 6 MHz).

The digital image data (refer to FIG. 4(*d*)) outputted from the plurality of serial-to-parallel conversion circuits 16*e* to 16*g*, the control signals and the clock signal outputted from the PLL circuit 16*h* are provided to the timing controller 17. The timing controller 17 generates a timing signal for image display according to these image data, control signals, and clock signal, and controls the LCD 18 so as to display an image (variant type) on the LCD 18.

Thus, since the frequency of the clock signal is multiplied by a factor of two by the transmit side, and the frequency of the clock signal is then divided by two by the receive side, digital image data of a variant type having a different clock frequency from LVDS can be transmitted using LVDS. Therefore, it is not necessary to newly provide a digital image transmission apparatus which supports digital image data of a variant type, and it is possible to transmit digital image data of a variant type using the digital image transmission apparatus for LVDS.

In the above-mentioned example, the frequency multiplier 21 multiplies the frequency of the clock signal by a factor of two, and the frequency divider 22 divides the frequency of the 2× clock signal by two, as previously explained. In this case, the multiplication ratio and the frequency dividing rate are determined according to both the clock frequency of the variant-type digital video signal and the clock frequency range of LVDS so that the multiplication ratio and frequency dividing rate are even numbers.

By the way, in the receive side, when dividing the frequency of the 2× clock signal by two to provide the division result as a clock signal, a phase shift may occur between the clock signal and the digital image data. That is, as shown in FIGS. 4(*e*) and 4(*f*), the clock signal and digital image data may be 180 degrees out of phase with each other, and a timing shift may occur between the clock signal and the digital image data. If the digital image data, control signals, and clock signal are provided to the timing controller 17 in such a state, the timing controller 17 will not be able to generate the timing signal for image display.

Figure 5:
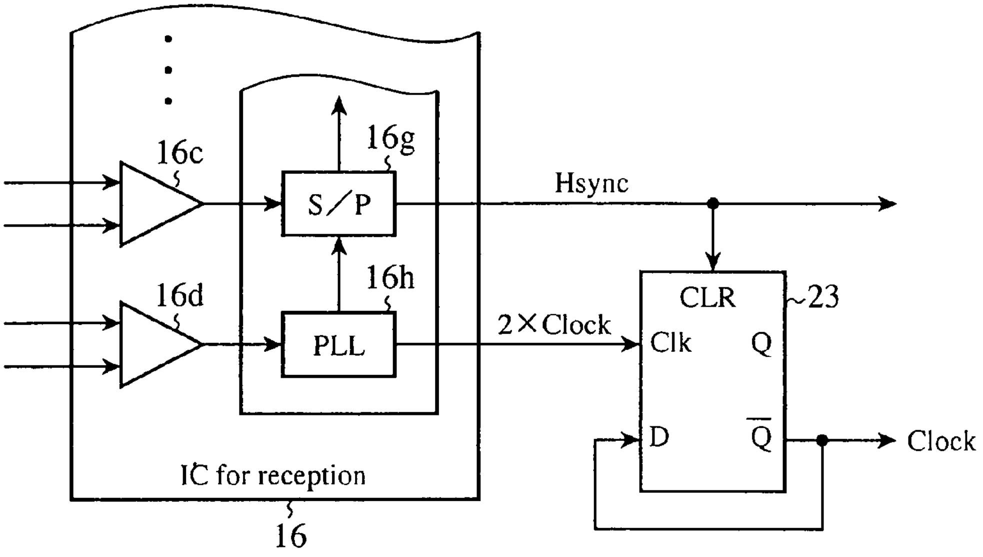
FIG. 5 is a diagram for explaining the frequency divider which is used in another example of the digital image transmission apparatus in accordance with embodiment 1 of the present invention.

For this reason, as shown in FIG. 5, a flip-flop circuit 23 is used as the frequency divider 22 so that the flip-flop circuit 23 can be reset in response to, for example, the horizontal synchronizing signal Hsync. FIG. 5 is a diagram showing a part of the receive side, and the 2× clock signal outputted from the PLL circuit 16*h* is provided to a Clk terminal of the flip-flop 23, as mentioned above. On the other hand, the horizontal synchronizing signal Hsync outputted from the serial-to-parallel conversion circuit 16*g* is provided to a reset terminal CLR of the flip-flop circuit 23.

In FIG. 5, a D connector and a Q (bar) terminal are connected to each other, and the clock signal is outputted from the Q (bar) terminal and is provided to the timing controller 17 (not shown in FIG. 5).

Figure 6:
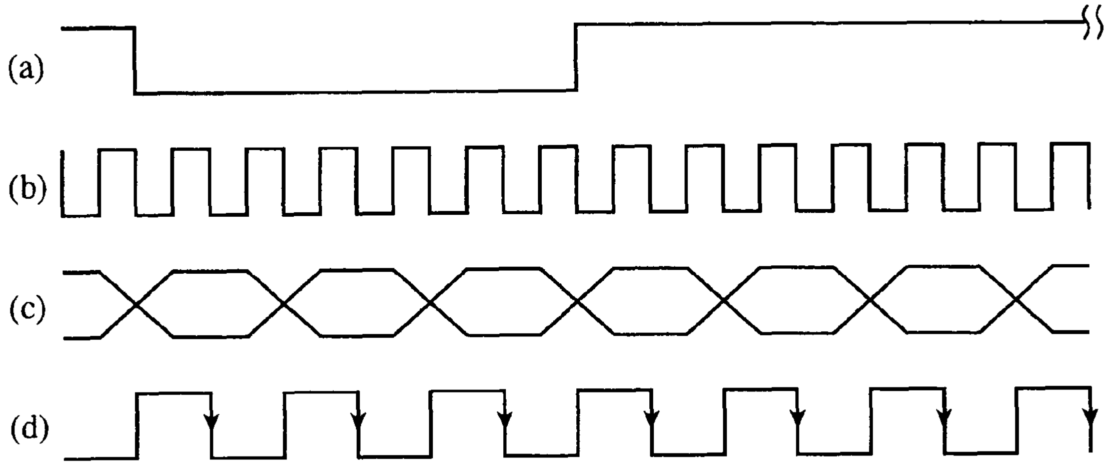
FIG. 6 is a timing chart for explaining a transmission process carried out by the digital image transmission apparatus using the frequency divider shown in FIG. 5, FIG. 6(*a*) is a diagram showing a horizontal synchronizing signal, FIG. 6(*b*) is a diagram showing a clock signal whose frequency is multiplied by the frequency multiplier, FIG. 6(*c*) is a diagram showing digital image data, and FIG. 6(*d*) is a diagram showing a clock signal whose frequency is divided by the frequency divider from the viewpoint of a relation with the digital image data shown in FIG. 6(*c*).

Referring now to FIG. 6, the horizontal synchronizing signal Hsync shown in FIG. 6(*a*) is provided to the reset terminal CLR of the flip-flop circuit 23 as a reset signal, and the flip-flop circuit 23 is reset in response to a falling edge of the horizontal synchronizing signal (i.e., a negative-polarity pulse). When the flip-flop circuit 23 is reset, it enters an initial state and then starts dividing the frequency of the 2× clock signal shown in FIG. 6(*b*) by two. Since the horizontal synchronizing signal Hsync is associated with the digital image data shown in FIG. 6(*c*), no phase shift occurs between the clock signal (refer to FIG. 6(*d*)) outputted from the flip-flop circuit 23 and the digital image data. As a result, a situation in which the timing controller 17 cannot generate the timing signal for image display can be avoided.

Thus, since the flip-flop circuit is used as the frequency divider and is reset in response to the horizontal synchronizing signal, no phase shift occurs between the digital image data and the clock signal when dividing the frequency of the 2× clock signal and providing the division result as a clock signal, and therefore a situation where no display timing for the digital image data cannot be created can be avoided.

In the above explanation, the horizontal synchronizing signal Hsync is used as the reset signal. As an alternative, the vertical synchronizing signal Vsync or the image enable signal Enable can be used as the reset signal. That is, since the horizontal synchronizing signal Hsync, vertical synchronizing signal Vsync, and image enable signal Enable are the control signals which are synchronized with the digital image data, one of these control signals can be used as the reset signal for resetting the flip-flop circuit 23.

As mentioned above, when transmitting a digital video signal having, as a variant clock signal, a clock signal whose frequency deviates from the frequency range of LVDS, the digital image transmission apparatus in accordance with this embodiment 1 multiplies the frequency of the variant clock signal, for example, to generate a transmit side clock signal having a frequency which falls within the frequency range of LVDS, and transmits, as a transmission digital video signal, digital image data and control signals, as well as the transmit side clock signal, according to the transmit side clock signal, and, the receive side of the digital image transmission apparatus divides the frequency of the transmit side clock signal, for example, so as to output the variant clock signal after acquiring the digital image data and control signals from the transmission digital video signal according to the transmit side clock signal. Therefore, the present embodiment offers an advantage of being able to transmit the digital image data of the variant type having a different clock frequency from LVDS using LVDS.

In accordance with this embodiment 1, the frequency divider is reset in response to any one of the horizontal synchronizing signal, vertical synchronizing signal, and image enable signal. Therefore, the present embodiment offers another advantage of being able to prevent any phase shift from occurring between the digital image data and the variant clock signal when dividing the frequency of the transmit side clock signal and providing the division result as a variant clock signal because the horizontal synchronizing signal, vertical synchronizing signal, and image enable signal are synchronized with the digital image data.

Industrial Applicability

As mentioned above, the contents transmission apparatus in accordance with the present invention is suitable for transmission of a digital video signal whose frequency does not fall within the timing clock frequency range of standardized digital video signals to a display unit provided with a display area of a variant type whose frequency range does not fall within the timing clock frequency range of standardized digital video signals.

The invention claimed is:

1. A digital image transmission apparatus which transmits a digital video signal including digital image data via an image generating unit that comprising a transmission side clock terminal and a transmission side phase locked loop (PLL) circuit, a control signal which is synchronized with said digital image data, and a clock signal in a predetermined frequency range of frequencies of said clock signal, said digital image transmission apparatus comprising:

a transmit side frequency conversion unit arranged between the transmission side clock terminal and an input terminal of the transmission side PLL circuit that, when transmitting a digital video signal having, as a variant clock signal, a clock signal of a frequency which does not fall within said predetermined frequency range, carries out a frequency conversion of the frequency of said variant clock signal so as to generate a transmit side clock signal having a frequency which falls within said predetermined frequency range;

a transmitting unit that transmits, as a transmission digital video signal, said digital image data and said control signal, as well as said transmit side clock signal, according to the transmit side clock signal;

a receiving unit that receives said transmit side digital video signal so as to acquire said digital image data and said control signal according to said transmit side clock signal, said receiving unit comprising reception side PLL circuit and a reception side clock terminal; and a receive side frequency conversion unit arranged between an output terminal of the reception side PLL circuit and an input terminal of the reception side clock terminal that carries out a frequency conversion of said transmit side clock signal so as to output said variant clock signal, wherein frequency multiplication ratio of said transmit side frequency conversion unit and frequency dividing rate of said receive side frequency conversion unit are determined according to both clock frequency of the variant clock signal and clock frequency range of the transmit side clock signal so that the multiplication ratio and frequency dividing rate are even numbers.

2. The digital image transmission apparatus according to claim 1, wherein said receive side frequency conversion unit is reset using, as a reset signal, the control signal which is synchronized with the digital image data.

3. The digital image transmission apparatus according to claim 2, wherein the control signal includes a horizontal synchronizing signal, a vertical synchronizing signal, and an image enable signal, and said horizontal synchronizing signal, said vertical synchronizing signal, or said image enable signal is used as the reset signal.

4. The digital image transmission apparatus according to claim 1, wherein the frequency of the variant clock signal is lower than the predetermined frequency range, said transmit side frequency conversion unit is a frequency multiplier, said receive side frequency conversion unit is a frequency divider.

5. The digital image transmission apparatus according to claim 4, wherein a flip-flop circuit is used as the frequency divider, said transmitting unit parallel-to-serial converts the digital image data and the control signal according to said transmit side clock signal, and transmits the parallel-to-serial converted digital image data and control signal as the transmission digital video signal, and said receiving unit serial-to-parallel converts said transmission digital video signal according to said transmit side clock signal so as to acquire said digital image data and said control signal.

* * * * *